(12) United States Patent
Choi et al.

(10) Patent No.: US 9,786,724 B2
(45) Date of Patent: Oct. 10, 2017

(54) ORGANIC LIGHT EMITTING DIODE DISPLAY, OPTICAL UNIT, AND METHOD FOR MANUFACTURING OPTICAL UNIT

(71) Applicant: SAMSUNG DISPLAY CO., LTD., Yongin, Gyeonggi-Do (KR)

(72) Inventors: Suk Choi, Seongnam-si (KR); Hee Young Lee, Suwon-si (KR); Cheol Kyu Kim, Seoul (KR); Sun Haeng Cho, Hwaseong-si (KR); Hyun-Joo Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 14/731,200

(22) Filed: Jun. 4, 2015

(65) Prior Publication Data
US 2016/0056215 A1    Feb. 25, 2016

(30) Foreign Application Priority Data

Aug. 22, 2014 (KR) .......................... 10-2014-0109604

(51) Int. Cl.
*G02B 5/30* (2006.01)
*H01L 27/32* (2006.01)
*H01L 51/52* (2006.01)

(52) U.S. Cl.
CPC ........ *H01L 27/3232* (2013.01); *G02B 5/3016* (2013.01); *H01L 27/3211* (2013.01); *H01L 51/5281* (2013.01)

(58) Field of Classification Search
CPC .............. G02B 5/3016; H01L 27/3232; H01L 51/5281; H01L 27/3211
See application file for complete search history.

(56) References Cited

U.S. PATENT DOCUMENTS

| 2011/0157540 | A1* | 6/2011 | Jung ....................... G02B 5/305 349/194 |
| 2012/0281157 | A1* | 11/2012 | Kim ..................... G02F 1/13363 349/15 |
| 2013/0242212 | A1* | 9/2013 | Huang ................. H01L 51/5271 349/15 |
| 2016/0092005 | A1* | 3/2016 | Toyoshima ........... H01L 27/323 345/174 |

FOREIGN PATENT DOCUMENTS

| JP | 2007-286235 A | 11/2007 |
| KR | 10-2010-0115718 A | 10/2010 |
| KR | 10-2013-0000310 A | 1/2013 |
| KR | 10-2013-0078727 A | 7/2013 |
| WO | WO 2005/050269 A1 | 6/2005 |

* cited by examiner

*Primary Examiner* — Kendrick Hsu
(74) *Attorney, Agent, or Firm* — Lewis Roca Rothgerber Christie LLP

(57) ABSTRACT

An organic light emitting diode display includes: a display module including a first organic light emitting diode to emit light with a first wavelength, a second organic light emitting diode to emit light with a second wavelength, and a third organic light emitting diode to emit light with a third wavelength; a phase difference layer including a first liquid crystal pattern on the first organic light emitting diode, and a second liquid crystal pattern on the second organic light emitting diode and the third organic light emitting diode; and a linear polarization layer on the phase difference layer.

15 Claims, 11 Drawing Sheets

(A)

|  | Theoretical value | Film | LC Coating |
|---|---|---|---|
| Retardation (550nm) | 137.5 nm | 147.1 nm | 140.6 nm |
| R(450) / R(550) | 0.81 | 0.90 | 0.87 |
| R(650) / R(550) | 1.18 | 1.01 | 1.02 |

(B)

ORGANIC LIGHT EMITTING DIODE DISPLAY, OPTICAL UNIT, AND METHOD FOR MANUFACTURING OPTICAL UNIT

CROSS-REFERENCE TO RELATED APPLICATION

This application claims priority to and the benefit of Korean Patent Application No. 10-2014-0109604 filed in the Korean Intellectual Property Office on Aug. 22, 2014, the entire content of which is incorporated herein by reference.

BACKGROUND

Field

The following description relates to an organic light emitting diode display, an optical unit, and a method for manufacturing an optical unit. More particularly, the following description relates to an organic light emitting diode display including a phase difference layer, an optical unit, and a method for manufacturing an optical unit.

Description of the Related Art

Examples of a flat panel display include an organic light emitting display, a liquid crystal display, and a plasma display panel. The organic light emitting diode display is an optical unit for suppressing reflection of outer light, and includes a linear polarizer and a $\lambda/4$ retarder. The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward an organic light emitting diode display for reducing or minimizing reflection of outer light, an optical unit, and a method for manufacturing an optical unit. Aspects of embodiments of the present invention are also directed toward a slim organic light emitting diode display, an optical unit, and a method for manufacturing an optical unit. Aspects of embodiments of the present invention are also directed toward providing a flexibility-improved organic light emitting diode display, an optical unit, and a method for manufacturing an optical unit.

According to an embodiment, an organic light emitting diode display includes: a display module, the display module including a first organic light emitting diode to emit light of a first wavelength, a second organic light emitting diode to emit light of a second wavelength, and a third organic light emitting diode to emit light of a third wavelength; a phase difference layer, the phase difference layer including a first liquid crystal pattern on the first organic light emitting diode, and a second liquid crystal pattern on the second organic light emitting diode and the third organic light emitting diode; and a linear polarization layer on the phase difference layer.

In some embodiments, the phase difference layer has a $\lambda/4$ phase difference value.

In some embodiments, the first liquid crystal pattern and the second liquid crystal pattern have different phase difference values.

In some embodiments, the second liquid crystal pattern includes an inverse wavelength dispersion liquid crystal.

In some embodiments, the second liquid crystal pattern has a $\lambda/4$ phase difference value of the second wavelength.

In some embodiments, the first liquid crystal pattern has a $\lambda/4$ phase difference value of the first wavelength.

In some embodiments, the first liquid crystal pattern includes a positive wavelength dispersion liquid crystal.

In some embodiments, the first liquid crystal pattern and the second liquid crystal pattern have substantially the same thickness.

In some embodiments, the first liquid crystal pattern includes an inverse wavelength dispersion liquid crystal.

In some embodiments, the first liquid crystal pattern and the second liquid crystal pattern have different thicknesses.

In some embodiments, the first wavelength is greater than the second wavelength and the third wavelength, and the second wavelength is greater than the third wavelength.

In some embodiments, the first organic light emitting diode is to emit red light, the second organic light emitting diode is to emit green light, and the third organic light emitting diode is to emit blue light.

In some embodiments, the first wavelength is less than the second wavelength and the third wavelength, and the second wavelength is greater than the third wavelength.

In some embodiments, the first organic light emitting diode is to emit blue light, the second organic light emitting diode is to emit red light, and the third organic light emitting diode is to emit green light.

In some embodiments, the phase difference layer further includes: a base film having a front side on which the first liquid crystal pattern and the second liquid crystal pattern are located; and an overcoat layer for covering the first liquid crystal pattern and the second liquid crystal pattern.

In some embodiments, the organic light emitting diode display further includes a touch sensor on a rear side of the base film.

According to an embodiment, an organic light emitting diode display includes: a display module, the display module including a first organic light emitting diode to emit light with a first wavelength and a second organic light emitting diode to emit light with a second wavelength; a phase difference layer, the phase difference layer including a first liquid crystal pattern on the first organic light emitting diode and a second liquid crystal pattern on the second organic light emitting diode; and a linear polarization layer on the phase difference layer.

According to an embodiment, an optical unit disposed on a display module includes a first organic light emitting diode to emit light with a first wavelength, a second organic light emitting diode to emit light with a second wavelength, and a third organic light emitting diode to emit light with a third wavelength, the optical unit comprising: a phase difference layer including a first liquid crystal pattern on the first organic light emitting diode, and a second liquid crystal pattern on the second organic light emitting diode and the third organic light emitting diode; and a linear polarization layer on the phase difference layer.

According to an embodiment, a method for manufacturing an optical unit includes forming a liquid crystal layer on a base film, exposing portions of the liquid crystal layer by utilizing a mask to form a first liquid crystal pattern and a second liquid crystal pattern, and forming an overcoat layer for covering the first liquid crystal pattern and the second liquid crystal pattern to form a phase difference layer; and forming a linear polarization layer on the phase difference layer.

In some embodiments, the forming of the phase difference layer is performed for the first liquid crystal pattern and the second liquid crystal pattern to have different phase difference values.

DETAILED DESCRIPTION

Figure 1:
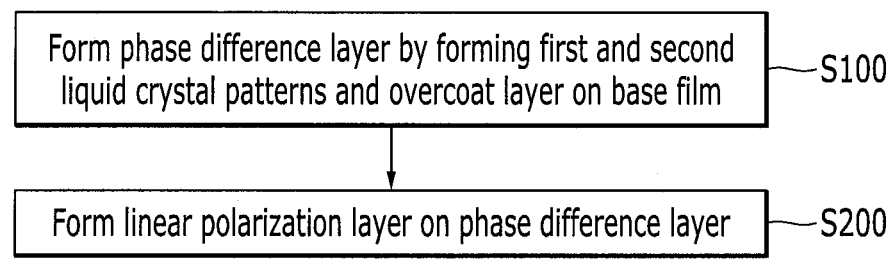
FIG. 1 is a flowchart illustrating a method for manufacturing an optical unit according to an embodiment of the present invention.

In the following detailed description, only certain embodiments of the present invention have been shown and described by way of illustration. As those skilled in the art would realize, the described embodiments may be modified in various different ways, all without departing from the spirit or scope of the present invention.

Like reference numerals designate like elements throughout the specification. Further, in the following description of embodiments of the present invention, components having the same configuration designated by the same reference numerals that are described in one embodiment are also available other embodiments, and only configurations that are different from an embodiment that has already been described are described in the other embodiments.

The size and thickness of each component illustrated in the drawings are illustrated for better understanding and ease of the described embodiments, but the present invention is not limited to the illustrations in the drawings.

In the drawings, the thickness of layers, films, panels, regions, and/or other components are exaggerated for clarity. For example, thicknesses of the layers, films, panels, regions, and/or other components, are enlarged in the drawings for better understanding and ease of description, but the present invention is not limited to the illustrations in the drawings. It will be understood that when an element such as a layer, film, region, or substrate is referred to as being "on" another element, it may be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Throughout the specification, it is understood that the term "on" and similar terms are used generally and are not necessarily related to a gravitational reference.

Also, as used herein, the terms "use," "using," and "used" may be considered synonymous with the terms "utilize," "utilizing," and "utilized," respectively. Further, as used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Additionally, as used herein, the term "substantially," "about," and similar terms are used as terms of approximation and not as terms of degree, and are intended to account for the inherent deviations in measured or calculated values that would be recognized by those of ordinary skill in the art.

A method for manufacturing an optical unit according to an embodiment of the present invention will now be described with reference to FIG. 1 and FIG. 2.

FIG. 1 is a flowchart illustrating a method for manufacturing an optical unit according to an embodiment of the present invention.

As shown in FIG. 1, a first liquid crystal pattern LCP1, a second liquid crystal pattern LCP2, and an overcoat layer (OC) are formed on a base film (BF) to form a phase difference layer (RL) (S100).

Figure 2:
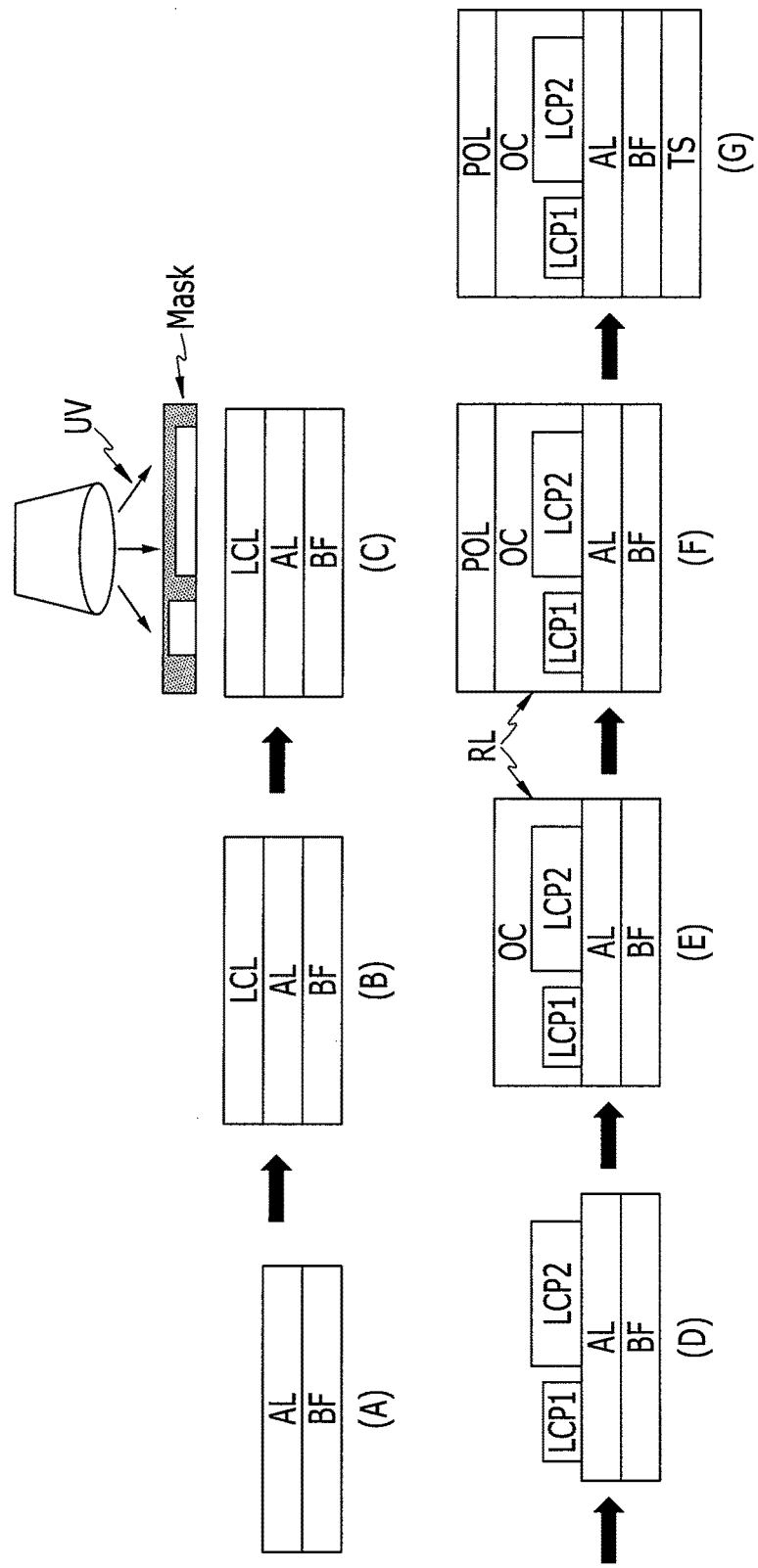
FIG. 2 is flow chart including cross-sectional views for illustrating a method for manufacturing an optical unit according to an embodiment of the present invention.

FIG. 2 is a flowchart including cross-sectional views to illustrate a method for manufacturing an optical unit according to an embodiment of the present invention.

Here, an alignment layer (AL) is formed on the base film (BF) as shown by (A) of FIG. 2, and a liquid crystal layer (LCL) is formed on the alignment layer (AL) as shown by (B) of FIG. 2.

In some embodiments, the alignment layer (AL) may be omitted and the liquid crystal layer (LCL) may be a polymer material layer including a liquid crystal material and a photoresist material.

As shown by (C) of FIG. 2, the liquid crystal layer (LCL) is then exposed and developed. In some embodiments, the liquid crystal layer (LCL) is exposed to ultraviolet rays (UV) using a mask such as a halftone mask or a slit mask to form a first liquid crystal pattern LCP1 and a second liquid crystal pattern LCP2 that are separated from the liquid crystal layer (LCL), as shown by (D) of FIG. 2. In some embodiments, the first liquid crystal pattern LCP1 and the second liquid crystal pattern LCP2 have different alignment states or different thicknesses based on the particular exposure process using a mask, such that first liquid crystal pattern LCP1 and the second liquid crystal pattern LCP2 have different phase difference values. That is, the first liquid crystal pattern LCP1 and the second liquid crystal pattern LCP2, respectively, may have a phase difference value based on the particular process for forming a first liquid crystal pattern LCP1 and a second liquid crystal pattern LCP2. The first liquid crystal pattern LCP1 and the second liquid crystal pattern LCP2 may also have a linear form in which they are extended on a surface in one direction or a dot form in which they are disposed in a matrix form.

As shown by (E) of FIG. 2, an overcoat layer (OC) for covering the first liquid crystal pattern LCP1 and the second liquid crystal pattern LCP2 is formed to form a phase difference layer (RL) including the base film (BF), the alignment layer (AL), the first liquid crystal pattern LCP1, the second liquid crystal pattern LCP2, and the overcoat layer (OC). In some embodiments, the alignment layer (AL) may be omitted.

The overcoat layer (OC) may be formed of an organic material or an inorganic material. In some embodiments, the overcoat layer (OC) protects the first liquid crystal pattern LCP1 and the second liquid crystal pattern LCP2. In some embodiments, the overcoat layer (OC) improves an adhesive property of a linear polarization layer (POL) to be formed on the overcoat layer (OC).

The linear polarization layer (POL) may be formed on the phase difference layer (RL) (S200). Here, as shown by (F) of FIG. 2, a linear polarization layer (POL) is formed on the overcoat layer (OC) to form the linear polarization layer (POL) on the phase difference layer (RL). The linear polarization layer (POL) may be in the form of a film (e.g., PVA), in the form of a layer (e.g., a layer formed by a coating), or in the form of a metal layer pattern (e.g., a wire grid polarizer (WGP)). An angle of intersection of an optical axis of the linear polarization layer (POL) and an optical axis of the phase difference layer (RL) may be 45 degrees.

As shown in FIG. 2 (G), a touch sensor (TS) may be formed on a rear side of the base film (BF) of the phase difference layer (RL). The touch sensor (TS) may include a sensor (sensor body) and a wire. The sensor (sensor body) may include a transparent conductive oxide (such as ITO), a conductive polymer material (such as silver nanowire (AgNW) or PEDOT), and/or a conductive material including carbon (such as graphene or carbon nanotubes (CNT)); a stacked body of transparent conductive oxides (such as silver nanowire (AgNW) and ITO); and/or a stacked body of a conductive polymer material (such as PEDOT) and a transparent conductive oxide (such as ITO). The sensor (sensor body) may include a bridge including an ITO, IZO, Cu, and/or Ag—Pd—Cu-based material.

The wire may include a Cu or Ag—Pd—Cu-based material and Ag.

As described above, the touch sensor (TS) may be formed various forms suitable for use in an optical unit.

The optical unit may be formed by the above-described process and may be stacked on a display module including an organic light emitting diode to manufacture an organic light emitting diode display.

An organic light emitting diode display according to an embodiment of the present invention will now be described with reference to FIGS. 3 to 8.

Figure 3:
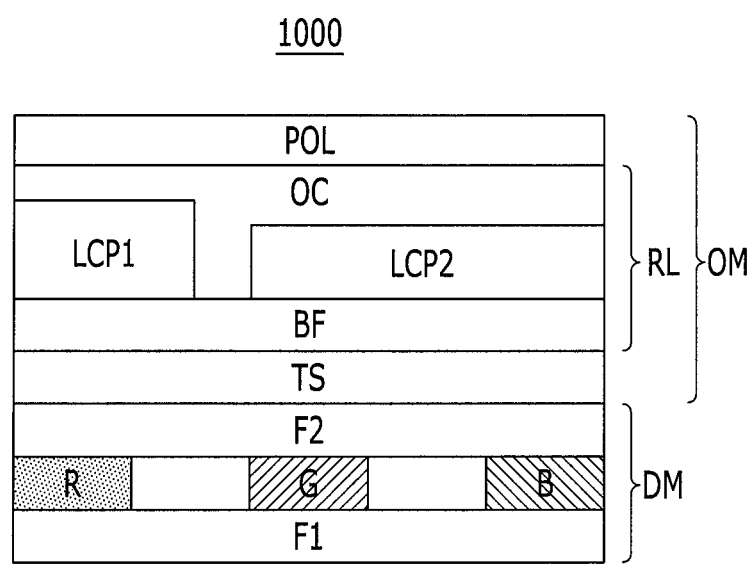
FIG. 3 shows a cross-sectional view illustrating an organic light emitting diode display according to an embodiment of the present invention.

FIG. 3 shows a cross-sectional view of an organic light emitting diode display according to an embodiment of the present invention.

As shown in FIG. 3, the organic light emitting diode display 1000 according to an embodiment of the present invention includes a display module (DM) and an optical unit (OM). Here, the display module (DM) is an organic light emitting diode display, and the optical unit (OM) is manufactured by the method for manufacturing the optical unit as already described herein.

In some embodiments, the optical unit (OM) is bonded to the display module (DM) by an adhesive layer such as an optically clear adhesive (OCA) or a pressure sensitive adhesive (PSA). In some embodiments, the optical unit (OM) may be directly formed on the display module (DM) by using micro electro mechanical systems (MEMS) including a photolithography process.

As shown in FIG. 3, the display module (DM) includes a first substrate F1, a first organic light emitting diode (R), a second organic light emitting diode (G), a third organic light emitting diode (B), and a second substrate F2. The first substrate F1 may be formed of a glass substrate or a polymer film (e.g., polyimide). In embodiments where a polymer film is used, the first substrate F1 may be flexible, bendable, rollable, foldable, and/or stretchable. As such, in these embodiments, the organic light emitting diode display 1000 may be flexible, bendable, rollable, foldable, and/or stretchable.

A driver for driving a first organic light emitting diode (R), a second organic light emitting diode (G), and a third organic light emitting diode (B) may be formed on the first substrate F1. By way of example, the driver may include at least one gate wire, at least one data wire, a plurality of thin film transistors connected to one organic light emitting diode, and at least one capacitor, however, embodiments of the present invention are not limited to a thereto, and the driver may be in various forms suitable for an organic light emitting diode.

The first organic light emitting diode (R), the second organic light emitting diode (G), and the third organic light emitting diode (B) may respectively include a first electrode, a second electrode on the first electrode, and an organic emission layer between the first electrode and the second electrode. At least one of the first electrode and the second electrode may be formed of an optical transmissible electrode, an optical semi-transmissible electrode, or an optical reflective electrode. The organic light emitting diode display 1000 according to an embodiment of the present invention allows the light respectively emitted by the first organic light emitting diode (R), the second organic light emitting diode (G), and the third organic light emitting diode (B) to be output in a direction of the optical unit (OM) onto which the linear polarization layer (POL) is located. The first organic light emitting diode (R), the second organic light emitting diode (G), and the third organic light emitting diode (B) may be formed in various suitable forms, respectively.

For ease of description, three organic light emitting diodes have been illustrated in an embodiment of the present invention, but the organic light emitting diode is not restricted thereto, and a plurality of (e.g., two or four or more) organic light emitting diodes may be used. The plurality of organic light emitting diodes may form a single image, and a single organic fight emitting diode may form a pixel that is a minimum unit for forming the image.

According to some embodiments of the present invention, the first organic light emitting diode (R) emits light with a first wavelength, the second organic light emitting diode (G) emits light with a second wavelength, and the third organic light emitting diode (B) emits light with a third wavelength. In some embodiments, the wavelengths are higher in ascending order of the third wavelength, the second wavelength, and the first wavelength, that is, the first wavelength is higher than the second wavelength and the third wavelength, and the second wavelength is higher than the third wavelength. For example, the first organic light emitting diode (R) may emit red light, the second organic light emitting diode (G) may emit green light, and the third organic light emitting diode (B) may emit blue light.

According to some embodiments of the present invention, the second substrate F2 may be formed as a glass substrate, a polymer film such as polyimide, or a thin film encapsulator; and when the second substrate F2 is formed as a thin film encapsulator, one or more organic layers and one or more inorganic layers may be alternately stacked.

According to some embodiments of the present invention, the optical unit (OM) includes a touch sensor (TS), a phase difference layer (RL), and a linear polarization layer (POL).

The touch sensor (TS) may include a sensor (sensor body) and a wire. The sensor (sensor body) may be located on a display area in which organic light emitting diodes of the display module (DM) are located and which displays images. The wire may be located on a non-display area neighboring the display area.

The sensor (sensor body) may include a transparent conductive oxide (such as ITO), a conductive polymer material (such as silver nanowire (AgNW) or PEDOT), and/or a conductive material including carbon (such as graphene and carbon nanotubes (CNT)); a stacked body of transparent conductive oxides (such as silver nanowire (AgNW) and ITO); and a stacked body of a conductive polymer material (such as PEDOT) and a transparent conductive oxide (such as ITO). The sensor (sensor body) may include a bridge including an ITO, IZO, Cu, and/or Ag—Pd—Cu-based material.

The wire may include a Cu or Ag—Pd—Cu-based material and Ag.

The touch sensor (TS) may be various suitable forms.

The phase difference layer (RL) has a λ/4 phase difference value and includes a base film (BF), a first liquid crystal pattern LCP1, a second liquid crystal pattern LCP2, and an overcoat layer (OC). The phase difference layer (RL) may further include an alignment layer for the first liquid crystal pattern LCP1, the second liquid crystal pattern LCP2, and the base film (BF).

Figure 4:
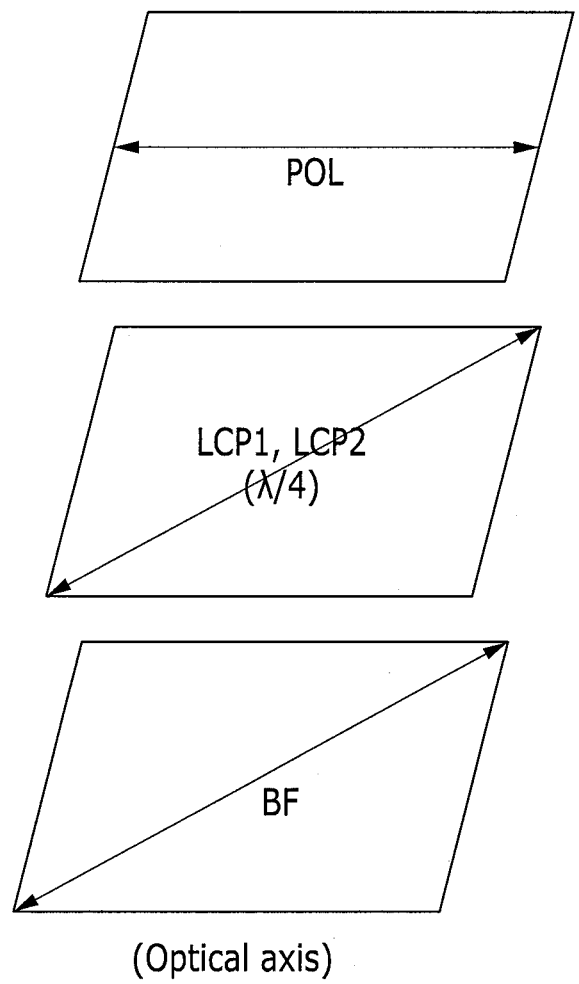
FIG. 4 shows an optical axis of a phase difference layer, a linear polarization layer, and a base film shown in FIG. 3.

FIG. 4 shows an optical axis of the phase difference layer, the linear polarization layer, and the base film (BF) shown in FIG. 3.

As shown in FIG. 4, the optical axes of the base film (BF), the first liquid crystal pattern LCP1, and the second liquid crystal pattern LCP2 form an angle of intersection of 45 degrees with respect to the optical axis of the linear polarization layer (POL), and the optical axis of the phase difference layer (RL) forms the angle of intersection of 45 degrees with respect to the optical axis of the linear polarization layer (POL) such that reflection of outer light may be controlled. In some embodiments, the base film (BF) is less than 10 nm thick such that generation of a phase-delay to the light transmitting through the base film (BF) may be more suitably controlled.

A general method for controlling reflection of outer light using a linear polarizer and a λ/4 retarder will now be described with reference to FIG. 5.

Figure 5:
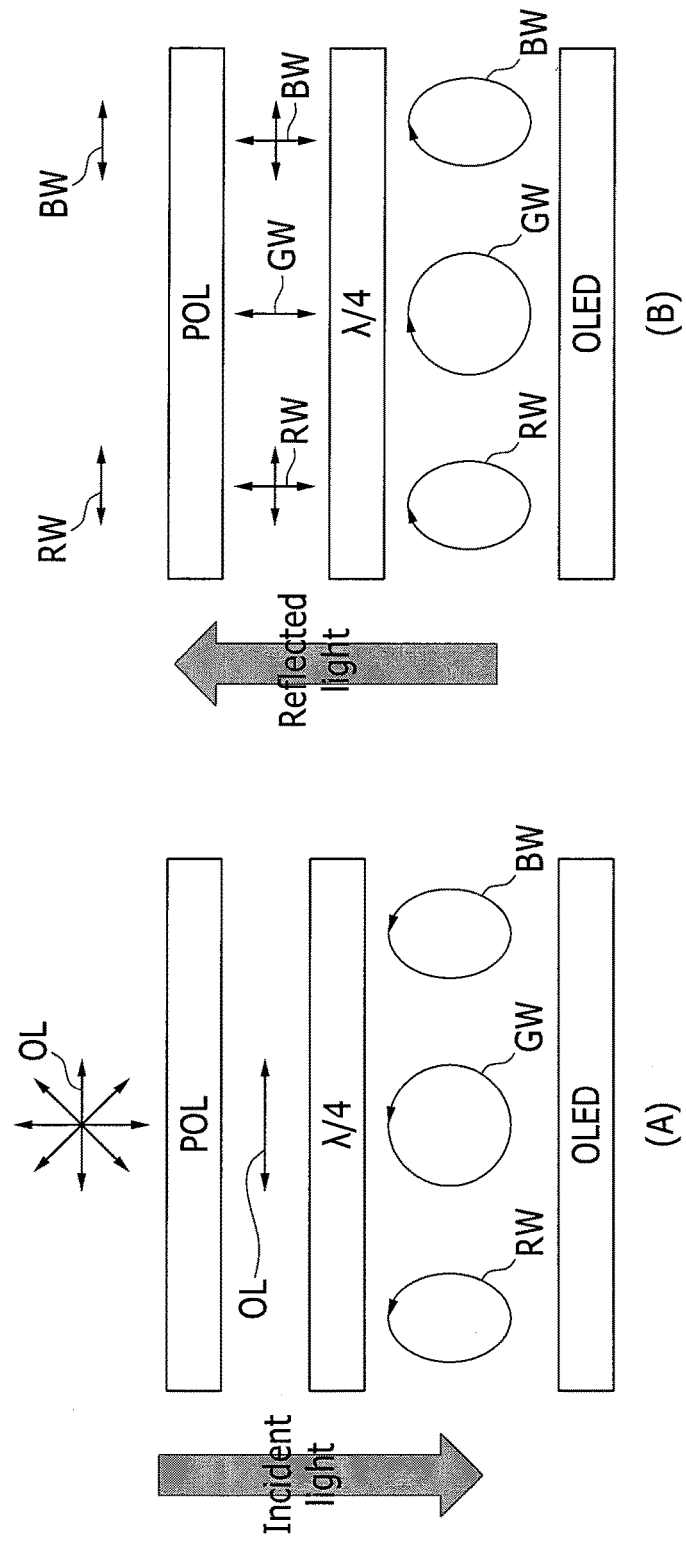
FIG. 5 shows cross-sectional views illustrating reflection of outer light using a general linear polarizer and a retarder.

FIG. 5 shows cross-sectional views of reflection of outer fight using a linear polarizer and a λ/4 retarder.

As shown by (A) of FIG. 5, outer light (OL) is input to a linear polarizer (POL), the light transmitting through the linear polarizer (POL) and not corresponding to a linear polarization axis of the linear polarizer (POL) is absorbed into the linear polarizer (POL) such that the outer light (OL) transmits through the linear polarizer (POL) and is linearly polarized. The linearly polarized outer light (OL) may then pass through a λ/4 retarder (λ/4) and may be left-circularly polarized, with a phase difference value of the λ/4 retarder (λ/4) generally set to the green wavelength (for example, 550 nm) with high photo-efficiency, such that when the linearly polarized outer light (OL) transmits through the λ/4 retarder (λ/4), the fight with the green wavelength (GW) (from among the light with the red wavelength (RW), the light with the green wavelength (GW), and the light with the blue wavelength (BW) included in the outer light (OL)) is circularly polarized and the light with the red wavelength (RW) and the light with the blue wavelength (BW) are ovally polarized.

As shown by (B) of FIG. 5, the light with the red wavelength (RW), the light with the green wavelength (GW), and the light with the blue wavelength (BW) are reflected on the organic light emitting diode (OLED), phase-delayed by 180 degrees, respectively, and after being transmitted through the λ/4 retarder (λ/4), the light with the green wavelength (GW) is completely linearly polarized to be absorbed into the linear polarizer (POL), and the light with the red wavelength (RW) and the light with the blue wavelength (BW) are not completely linearly polarized light. As a result, the light with the red wavelength (RW) and the light with the blue wavelength (BW) may digress from the optical axis of the linear polarizer (POL) and may transmit through the linear polarizer (POL), and be visible to the outside. That is, the outer light OL is reflected on the organic light emitting diode (OLED), and part of the light with the red wavelength (RW) and the light with the blue wavelength (BW) from among the reflected light is visible to the outside, which may be referred to as leakage of light.

As described in more detail below, some embodiments of the present invention are directed to a reducing leakage of light.

Figure 6:
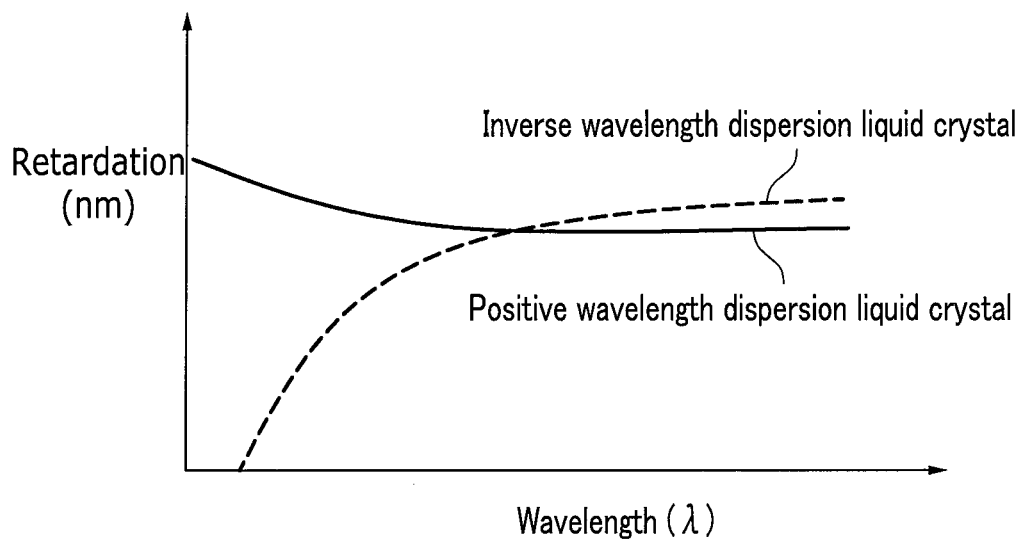
FIG. 6 shows a graph indicating changes of a phase difference value as a function of wavelengths for inverse wavelength dispersion liquid crystal and positive wavelength dispersion liquid crystal.

FIG. 6 shows a graph for indicating changes of a phase difference value according to wavelengths of inverse wavelength dispersion liquid crystal and positive wavelength dispersion liquid crystal. An X-axis of the graph represents the wavelength and a Y-axis represents the phase difference value in FIG. 6.

As shown in FIG. 6, positive wavelength dispersion liquid crystal for which the phase difference value is increased or decreased as the wavelength is increased, and inverse wavelength dispersion liquid crystal for which the phase difference value is increased as the wavelength is increased, was evaluated.

When the inverse wavelength dispersion liquid crystal was used as a phase difference layer through the above-noted process, the phase difference value of the phase difference layer varied with wavelength of the outer light that is input to the phase difference layer such that the efficiency of controlling reflection of outer light was improved.

Figure 7:
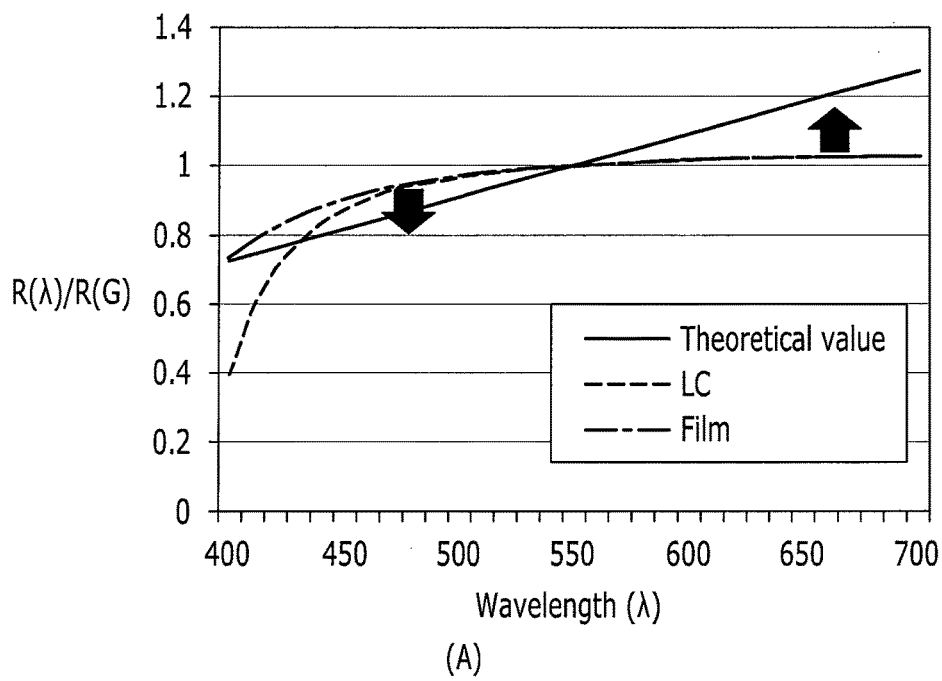
FIG. 7 includes a graph (A) and a table (B) showing a theoretical phase difference value as a function of wavelength; a phase difference value of a film having an inverse wavelength dispersion characteristic as a function of wavelength; and a phase difference value of liquid crystal having an inverse wavelength dispersion characteristic as a function of wavelength.

FIG. 7 includes a graph (A) and a table (B) showing a theoretical phase difference value as a function of wavelength, a phase difference value of a film having an inverse wavelength dispersion characteristic as a function of wavelength, and a phase difference value of liquid crystal having an inverse wavelength dispersion characteristic as a function of wavelength. The X-axis of (A) in FIG. 7 represents the wavelength (nm), and the Y-axis represents a ratio of the phase difference value caused by respective wavelengths with respect to the phase difference value caused by the wavelength (550 nm) of the green.

As shown by (A) and (B) of FIG. 7, when a film having an inverse wavelength dispersion characteristic for which the phase difference value is adjusted to the wavelength 550 nm (green), and a liquid crystal (LC) coating was evaluated, the resultant values were found to be different from the theoretical values. The film having an inverse wavelength dispersion characteristic and the liquid crystal (LC) coating were respectively checked to affirm that they could not generate a complete regular reflection in the red and blue wavelength bands, and in particular, it was found that each approached the theoretical values in the blue wavelength (450 nm), but they have a big difference in the red wavelength (650 nm).

In view of the above, according to embodiments of the present invention, an organic light emitting diode display 1000 includes a phase difference layer (RL) including a first liquid crystal pattern LCP1 and a second liquid crystal pattern LCP2.

In some embodiments, the first liquid crystal pattern LCP1 is located on a first organic light emitting diode (R) for emitting light with a first wavelength that is red light, and includes a positive wavelength dispersion liquid crystal for which the phase difference value is substantially not changed or is reduced as the wavelength is increased.

In some embodiments, the phase difference value of the first liquid crystal pattern LCP1 has a $\lambda/4$ phase difference value of the first wavelength, and for example, when the first organic light emitting diode (R) has the first wavelength of 650 nm, the first liquid crystal pattern LCP1 has the phase difference value of 162.5 nm.

In some embodiments, the phase difference value of the first liquid crystal pattern LCP1 is proportional to the phase difference value of liquid crystal included in the first liquid crystal pattern LCP1 and a thickness of the first liquid crystal pattern LCP1 such that the phase difference value of the first liquid crystal pattern LCP1 is controllable by controlling the thickness of the first liquid crystal pattern LCP1 including the positive wavelength dispersion liquid crystal.

In some embodiments, the second liquid crystal pattern LCP2 has a phase difference value that is different from that of the first liquid crystal pattern LCP1. That is, the first liquid crystal pattern LCP1 and the second liquid crystal pattern LCP2 respectively have different phase difference values.

In some embodiments, the second liquid crystal pattern LCP2 is located on a second organic light emitting diode (G) for emitting light with a second wavelength that is green light and a third organic light emitting diode (B) for emitting light with a third wavelength that is blue light. In some embodiments, the second liquid crystal pattern LCP2 includes inverse wavelength dispersion liquid crystal for which a phase difference value is increased as the wavelength is increased.

In some embodiments, the phase difference value of the second liquid crystal pattern LCP2 has a $\lambda/4$ phase difference value of the second wavelength, and for example, when the second organic light emitting diode (G) has the second wavelength of 550 nm, the second liquid crystal pattern LCP2 has the phase difference value of 137.5 nm with respect to the green light having the second wavelength.

In some embodiments, the phase difference value of the second liquid crystal pattern LCP2 is proportional to the phase difference value of liquid crystal included in the second liquid crystal pattern LCP2 and a thickness of the second liquid crystal pattern LCP2, such that the phase difference value of the second liquid crystal pattern LCP2 is controllable by controlling the thickness of the second liquid crystal pattern LCP2 including the inverse wavelength dispersion liquid crystal. The thickness of the second liquid crystal pattern LCP2 may be equal to or different from the thickness of the first liquid crystal pattern LCP1.

In some embodiments, since the second liquid crystal pattern LCP2 includes the inverse wavelength dispersion liquid crystal, it has a phase difference value that is substantially similar to the $\lambda/4$ phase difference value for the blue light having the third wavelength emitted by the third organic light emitting diode (B). For example, when the third organic light emitting diode (B) has the third wavelength of 450 nm, the second liquid crystal pattern LCP2 may have the phase difference value of 110 nm to 115 nm, that is, $\lambda/4$ of the blue light having a third wavelength.

The overcoat layer (OC) may be formed of an organic material or an inorganic material. The overcoat layer (OC) may protect the first liquid crystal pattern LCP1 and the second liquid crystal pattern LCP2 and/or may improve an adhesive property of a linear polarization layer (POL) to be formed on the overcoat layer (OC).

The linear polarization layer (POL) is located on the phase difference layer (RL). The linear polarization layer (POL) may have in the form of a film (e.g., a PVA film), in the form of a layer (e.g., formed by coating), or in the form of a metal layer pattern (e.g., a wire grid polarizer (WGP)). In addition, an angle of intersection of an optical axis of the linear polarization layer (POL) and an optical axis of the phase difference layer (RL) may be 45 degrees, and the linear polarization layer (POL) may absorb light with an optical axis excluding a set or predetermined optical axis.

In the organic light emitting diode display 1000 according to embodiments of the present invention, outer light is input to the linear polarization layer (POL) and passes through the linear polarization layer (POL). Light that does not correspond to the linear polarization axis of the linear polarization layer (POL) is absorbed into the linear polarization layer (POL), such that the outer light passes through the linear polarization layer (POL) and is then linearly polarized. The linearly polarized outer light passes through the phase difference layer (RL), the light with the red wavelength included in the outer light passes through the first liquid crystal pattern LCP1 and is circularly polarized, and the light with the green wavelength and the light with the blue wavelength respectively pass through the second liquid crystal pattern LCP2 and are circularly polarized.

The light with the red wavelength, the light with the green wavelength, and the light with the blue wavelength are selectively reflected on the first organic light emitting diode (R), the second organic light emitting diode (G), and the third organic light emitting diode (B). The light reflected by the first organic light emitting diode (R) passes through an organic emission layer of the first organic light emitting diode (R) and is changed into the light with the red wavelength and is phase-delayed by 180 degrees, the light reflected by the second organic light emitting diode (G) passes through an organic emission layer of the second organic fight emitting diode (G) and is changed into the light with the green wavelength and is phase-delayed by 180 degrees, and the light reflected by the third organic light emitting diode (B) passes through an organic emission layer and is changed into the light with the blue wavelength and is phase-delayed by 180 degrees.

The light with the red wavelength phase-delayed by 180 degrees passes through the first liquid crystal pattern LCP1 on the first organic light emitting diode (R), is linearly polarized, and is absorbed into the linear polarization layer (POL); the light with the green wavelength phase-delayed by 180 degrees passes through the second liquid crystal pattern LCP2 on the second organic light emitting diode (G), is linearly polarized, and is absorbed into the linear polarization layer (POL); and the light with the blue wavelength phase-delayed by 180 degrees passes through the second liquid crystal pattern LCP2 on the third organic light emitting diode (B), most of the light is linearly polarized and is absorbed into the linear polarization layer (POL).

That is, the light with the red wavelength, the light with the green wavelength, and most of the light with the blue wavelength that are provided in a visible ray region from among the outer light are reflected by the first organic light emitting diode (R), the second organic light emitting diode (G), and the third organic light emitting diode (B); pass through the phase difference layer (RL); and are absorbed by the linear polarization layer (POL), thereby reducing or minimizing reflection of the outer light.

An evaluation of the effect of an organic light emitting diode display according to an embodiment of the present invention will now be described with reference to FIG. 8.

Figure 8:
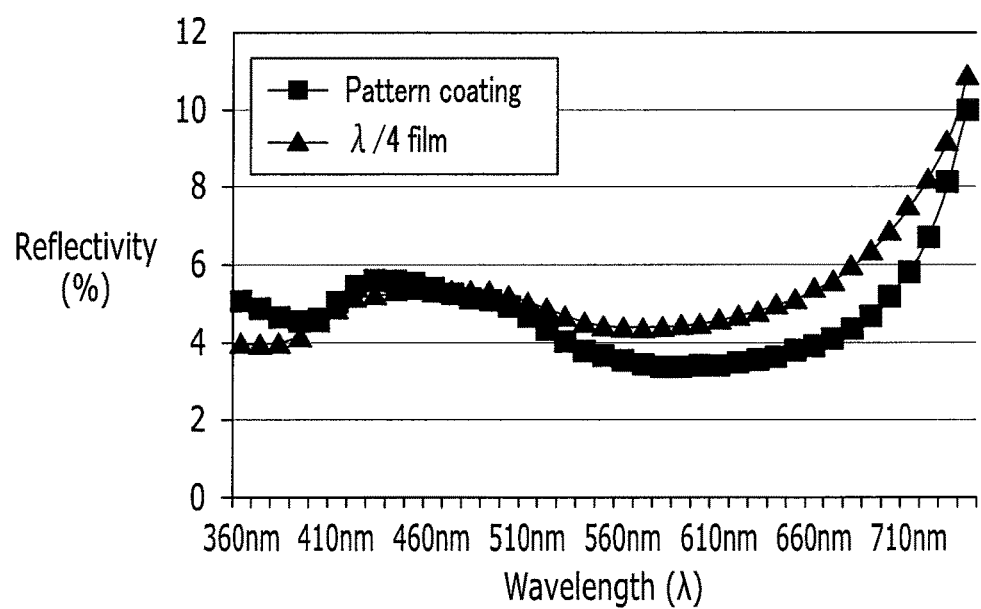
FIG. 8 is a graph showing reflection of outer light of an organic light emitting diode display as a function of wavelength according to an embodiment of the present invention and reflection of outer light of an organic light emitting diode display including a retarder according to a wavelength.

FIG. 8 shows a graph for showing reflection of outer light of an organic light emitting diode display as a function of wavelength according to an embodiment of the present invention, and reflection of outer light of an organic light emitting diode display including a general retarder as a function of wavelength. The X-axis represents the wavelength and the Y-axis indicates outer light reflectivity.

As shown in FIG. 8, reflectivity of the outer light of the organic light emitting diode display ("Pattern coating") according to an embodiment of the present invention is less than that of the organic light emitting diode display (λ/4 film) including a general retarder.

The organic light emitting diode display 1000 according to an embodiment of the present invention may minimize or reduce the reflection of outer light. That is, according to embodiments of the present invention, the organic light emitting diode display 1000 has minimized or reduced reflection of outer light.

Also, regarding the organic light emitting diode display 1000 according to an embodiment of the present invention, the phase difference layer (RL) is not be a retarder with a general polymer film, but a coating with a patterned liquid crystal, and the linear polarization layer (POL) is coated, such that the organic light emitting diode display 1000 becomes slim. That is, according so some embodiments, the organic light emitting diode display 1000 is provided to be slim.

Further, regarding the organic light emitting diode display 1000 according to an embodiment of the present invention, the phase difference layer (RL) is formed to not be a retarder with a general polymer film, but a coating with a patterned liquid crystal, and the linear polarization layer (POL) is coated, such that flexibility of the organic light emitting diode display 1000 is improved. That is, flexibility of the optical unit (OM) is improved such that when the display module (DM) is formed to be flexible, bendable, rollable, foldable, and/or stretchable, the organic light emitting diode display 1000 may be formed to be flexible, bendable, rollable, foldable, and/or stretchable. That is, in some embodiments, the organic light emitting diode display 1000 is flexible, bendable, rollable, foldable, and/or stretchable.

An organic light emitting diode display according to a further embodiment of the present invention will now be described with reference to FIG. 9.

Figure 9:
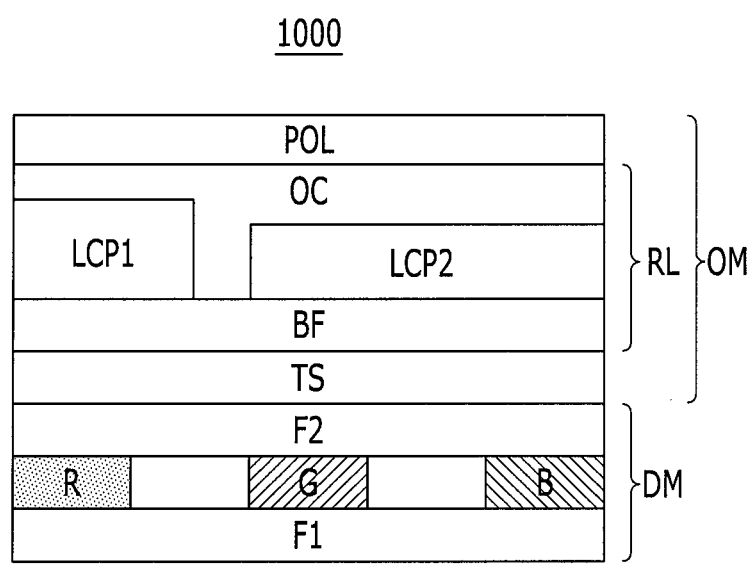
FIG. 9 shows a cross-sectional view illustrating an organic light emitting diode display according to an embodiment of the present invention.

FIG. 9 shows a cross-sectional view of an organic light emitting diode display according to an embodiment of the present invention.

As shown in FIG. 9, a first liquid crystal pattern LCP1 of a phase difference layer (RL) of the organic light emitting diode display 1000 according to an embodiment of the present invention includes inverse wavelength dispersion liquid crystal.

The first liquid crystal pattern LCP1 is on a first organic light emitting diode (R) for emitting light with a first wavelength that is red light, and includes inverse wavelength dispersion liquid crystal for which a phase difference value is increased as a wavelength is increased.

The phase difference value of the first liquid crystal pattern LCP1 has a λ/4 phase difference value of the first wavelength, and for example, when the first organic light emitting diode (R) has the first wavelength of 650 nm, the first liquid crystal pattern LCP1 has the phase difference value of 162.5 nm.

The phase difference value of the first liquid crystal pattern LCP1 is proportional to the phase difference value of liquid crystal included in the first liquid crystal pattern LCP1 and a thickness of the first liquid crystal pattern LCP1 such that the phase difference value of the first liquid crystal pattern LCP1 is controllable by controlling the thickness of the first liquid crystal pattern LCP1 including inverse wavelength dispersion liquid crystal.

The first liquid crystal pattern LCP1 and the second liquid crystal pattern LCP2 respectively include inverse wavelength dispersion liquid crystal and respectively have different phase difference values, so a thickness of the first liquid crystal pattern LCP1 is different from that of the second liquid crystal pattern LCP2.

As described, regarding the organic light emitting diode display 1000 according to an embodiment of the present invention, outer light is input to the linear polarization layer (POL) and passes through the linear polarization layer (POL). Light that does not correspond to the linear polarization axis of the linear polarization layer (POL) is absorbed into the linear polarization layer (POL), such that the outer light passes through the linear polarization layer (POL) and is then linearly polarized. The linearly polarized outer light passes through the phase difference layer (RL), the light with the red wavelength included in the outer light passes through the first liquid crystal pattern LCP1 and is circularly polarized, and the light with the green wavelength and the light with the blue wavelength respectively pass through the second liquid crystal pattern LCP2 and are circularly polarized.

The light with the red wavelength, the light with the green wavelength, and the light with the blue wavelength are selectively reflected on the first organic light emitting diode (R), the second organic light emitting diode (G), and the third organic light emitting diode (B). The light reflected by the first organic light emitting diode (R) passes through an organic emission layer of the first organic light emitting diode (R), is changed into the light with the red wavelength, and is phase-delayed by 180 degrees. The light reflected by the second organic light emitting diode (G) passes through an organic emission layer of the second organic light emitting diode (G), is changed into the light with the green wavelength, and is phase-delayed by 180 degrees. The light reflected by the third organic light emitting diode (B) passes through an organic emission layer, is changed into the light with the blue wavelength, and is phase-delayed by 180 degrees.

The light with the red wavelength phase-delayed by 180 degrees passes through the first liquid crystal pattern LCP1 on the first organic light emitting diode (R), is linearly polarized, and is absorbed into the linear polarization layer (POL). The light with the green wavelength phase-delayed by 180 degrees passes through the second liquid crystal pattern LCP2 on the second organic light emitting diode (G), is linearly polarized, and is absorbed into the linear polarization layer (POL), The light with the blue wavelength phase-delayed by 180 degrees passes through the second liquid crystal pattern LCP2 on the third organic light emitting diode (B), and most of the light is linearly polarized and absorbed into the linear polarization layer (POL).

That is, the light with the red wavelength, the light with the green wavelength, and most of the light with the blue wavelength that are provided in a visible ray region from among the outer light are reflected by the first organic light emitting diode (R), the second organic light emitting diode (G), and the third organic light emitting diode (B), pass through the phase difference layer (RL), and are absorbed by the linear polarization layer (POL), thereby minimizing or reducing reflection of the outer light.

That is, the organic light emitting diode display 1000, according to embodiments of the present invention, may have minimized or reduced reflection of outer light.

An organic light emitting diode display according to an embodiment of the present invention will now be described with reference to FIG. 10.

Figure 10:
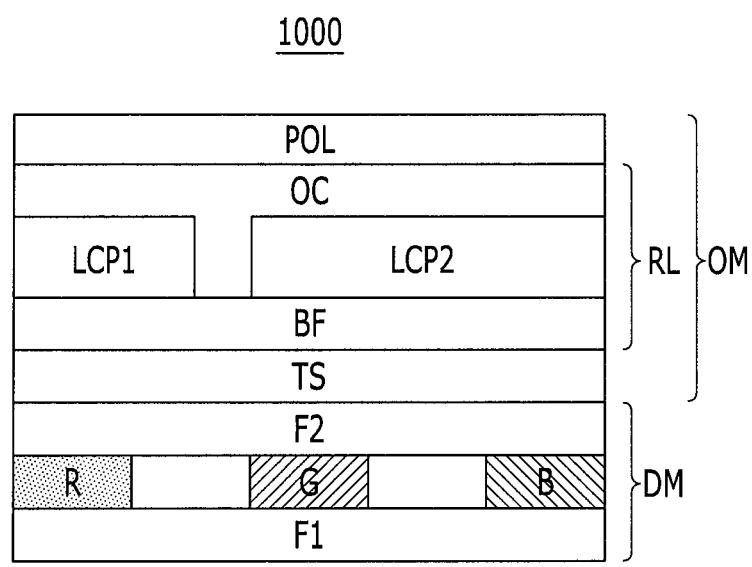
FIG. 10 shows a cross-sectional view illustrating an organic light emitting diode display according to an embodiment of the present invention.

FIG. 10 shows a cross-sectional view of an organic light emitting diode display according to another embodiment of the present invention.

As shown in FIG. 10, a first liquid crystal pattern LCP1 of a phase difference layer (RL) of the organic light emitting diode display 1000 according to another embodiment of the present invention includes positive wavelength dispersion liquid crystal, and a second liquid crystal pattern thereof includes inverse wavelength dispersion liquid crystal.

As described above, the first liquid crystal pattern LCP1 and the second liquid crystal pattern LCP2 have different phase difference values, but since the first liquid crystal pattern LCP1 includes positive wavelength dispersion liquid crystal and the second liquid crystal pattern LCP2 includes inverse wavelength dispersion liquid crystal, a suitable phase difference value of the positive wavelength dispersion liquid crystal of the first liquid crystal pattern LCP1 may be controlled and suitable phase difference value of the inverse wavelength dispersion liquid crystal of the second liquid crystal pattern LCP2 may be controlled such that the first liquid crystal pattern LCP1 and the second liquid crystal pattern LCP2 have the same thickness. That is, in some embodiments, the first liquid crystal pattern LCP1 and the second liquid crystal pattern LCP2 have the same thickness.

As described herein, the organic light emitting diode display 1000 according to an embodiment of the present invention allows for the first liquid crystal pattern LCP1 and the second liquid crystal pattern LCP2 to have the same thickness, thereby controlling differentiation of the photo-efficiencies of light of the first liquid crystal pattern LCP1 and the second liquid crystal pattern LCP2.

That is, according to some embodiments, the first liquid crystal pattern LCP1 and the second liquid crystal pattern LCP2 have the same thickness in order to suppress the differentiation of the photo-efficiencies of light respectively passing through the first liquid crystal pattern LCP1 and the second liquid crystal pattern LCP2, such that deformation of the entire image or generation of stains on the image caused by the difference of the photo-efficiency thereof may be controlled.

Thus, according to embodiments of the present invention, the organic light emitting diode display 1000 has controlled deterioration of image quality.

An organic light emitting diode display according to an embodiment of the present invention will now be described with reference to FIG. 11.

Figure 11:
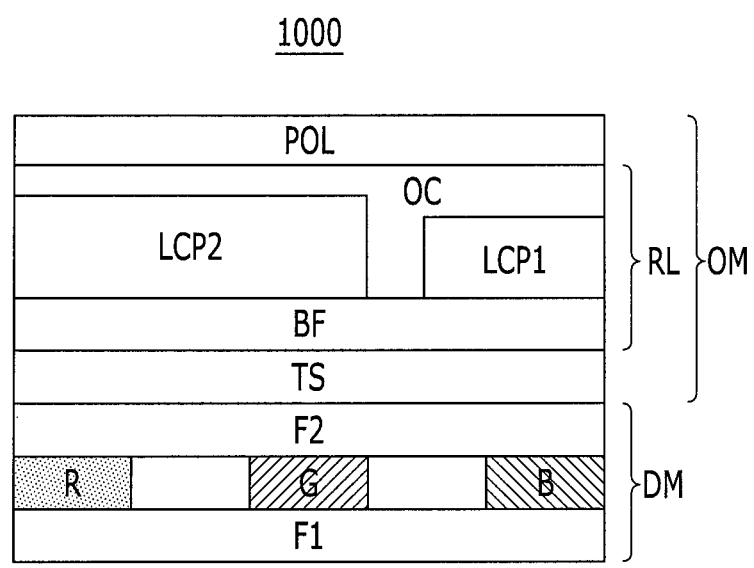
FIG. 11 shows a cross-sectional view illustrating an organic light emitting diode display according to an embodiment of the present invention.

FIG. 11 shows a cross-sectional view illustrating an organic light emitting diode display according to an embodiment of the present invention.

The first organic light emitting diode (B) emits light with a first wavelength, the second organic light emitting diode (R) emits light with a second wavelength, and the third organic light emitting diode (G) emits light with a third wavelength. Here, the first wavelength is lower than the second wavelength and the third wavelength, and the second wavelength is higher than the third wavelength. For example, the first organic light emitting diode (B) emits blue light, the second organic light emitting diode (R) emits red light, and the third organic light emitting diode (G) emits green light.

The first liquid crystal pattern LCP1 is on the first organic light emitting diode (B) for emitting light with a first wavelength that is blue light, and includes positive wavelength dispersion liquid crystal for which the phase difference value is not changed or is reduced as the wavelength is increased, or inverse wavelength dispersion liquid crystal for which the phase difference value is increased as the wavelength is increased.

The first liquid crystal pattern LCP1 has a $\lambda/4$ phase difference value of the first wavelength, and for example, when the first organic light emitting diode (B) has a first wavelength of 450 nm, the first liquid crystal pattern LCP1 has the phase difference value of 112.5 nm.

The phase difference value of the first liquid crystal pattern LCP1 is proportional to the phase difference value of the liquid crystal included in the first liquid crystal pattern LCP1 and the thickness of the first liquid crystal pattern LCP1 such that the phase difference value of the first liquid crystal pattern LCP1 may be controlled by controlling the thickness of the first liquid crystal pattern LCP1 including positive wavelength dispersion liquid crystal or inverse wavelength dispersion liquid crystal.

The second liquid crystal pattern LCP2 has a phase difference value that is different from that of the first liquid crystal pattern LCP1. That is, the first liquid crystal pattern LCP1 and the second liquid crystal pattern LCP2 have different phase difference values.

The second liquid crystal pattern LCP2 is located on the second organic light emitting diode (R) for emitting light with a second wavelength that is red light and the third organic light emitting diode (G) for emitting light with a third wavelength that is green light. The second liquid crystal pattern LCP2 includes inverse wavelength dispersion liquid crystal for which the phase difference value is increased as the wavelength is increased.

The second liquid crystal pattern LCP2 has a $\lambda/4$ phase difference value of the second wavelength, and for example, when the second organic light emitting diode (R) has the second wavelength of 650 nm, the second liquid crystal pattern LCP2 has the phase difference value of 162.5 nm for the red light having the second wavelength.

Since the phase difference value of the second liquid crystal pattern LCP2 is proportional to the phase difference value of the liquid crystal included in the second liquid crystal pattern LCP2 and the thickness of the second liquid crystal pattern LCP2, the phase difference value of the second liquid crystal pattern LCP2 may be controlled by controlling the thickness of the second liquid crystal pattern LCP2 including inverse wavelength dispersion liquid crystal. The thickness of the second liquid crystal pattern LCP2 may be different from or equal to the same as that of the first liquid crystal pattern LCP1.

In these embodiments, because the second liquid crystal pattern LCP2 includes inverse wavelength dispersion liquid crystal, it has a phase difference value that is similar to the $\lambda/4$ phase difference value for the green light having the third wavelength emitted by the third organic light emitting diode (G).

For example, when the third organic light emitting diode (G) has the third wavelength of 550 nm, the second liquid crystal pattern LCP2 may have the phase difference value of 135 nm to 140 nm that is λ/4 of the green light having a third wavelength.

According to embodiments of the present invention, in the organic light emitting diode display 1000 according to an embodiment of the present invention, outer light is input to the linear polarization layer (POL) and passes through the linear polarization layer (POL). Light that does not correspond to the linear polarization axis of the linear polarization layer (POL) is absorbed into the linear polarization layer (POL), such that the outer light passes through the linear polarization layer (POL) and is then linearly polarized, the linearly polarized outer light passes through the phase difference layer (RL). The light with the blue wavelength included in the outer light passes through the first liquid crystal pattern LCP1 and is circularly polarized, and the light with the red wavelength and the light with the green wavelength respectively pass through the second liquid crystal pattern LCP2 and are circularly polarized.

The light with the blue wavelength, the light with the red wavelength, and the light with the green wavelength are selectively reflected on the first organic light emitting diode (B), the second organic light emitting diode (R), and the third organic light emitting diode (G), the light reflected by the first organic light emitting diode (B) passes through an organic emission layer of the first organic light emitting diode (B), is changed into the light with the blue wavelength, and is phase-delayed by 180 degrees. The light reflected by the second organic light emitting diode (R) passes through an organic emission layer of the second organic light emitting diode (R), is changed into the light with the red wavelength, and is phase-delayed by 180 degrees. The light reflected by the third organic light emitting diode (G) passes through an organic emission layer, is changed into the light with the green wavelength, and is phase-delayed by 180 degrees.

The light with the blue wavelength phase-delayed by 180 degrees passes through the first liquid crystal pattern LCP1 on the first organic light emitting diode (B), is linearly polarized, and is absorbed into the linear polarization layer (POL). The light with the red wavelength phase-delayed by 180 degrees passes through the second liquid crystal pattern LCP2 on the second organic light emitting diode (R), is linearly polarized, and is absorbed into the linear polarization layer (POL). The light with the green wavelength phase-delayed by 180 degrees passes through the second liquid crystal pattern LCP2 on the third organic light emitting diode (G), and most of the light is linearly polarized and is absorbed into the linear polarization layer (POL).

That is, the light with the blue wavelength, the light with the red wavelength, and most of the light with the green wavelength that are provided in a visible ray region from among the outer light are reflected by the first organic light emitting diode (B), the second organic light emitting diode (R), and the third organic light emitting diode (G), and pass through the phase difference layer (RL), and then absorbed by the linear polarization layer (POL), thereby minimizing or reducing reflection of the outer light.

As described, the organic light emitting diode display 1000 according to an embodiment of the present invention minimizes or reduces the reflection of outer light. That is, the organic light emitting diode display 1000 according to embodiments of the present invention may have minimized or reduced reflection of outer light.

While this invention has been described in connection with some example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode display comprising:
   a display module, the display module including a first organic light emitting diode to emit light of a first wavelength, a second organic light emitting diode to emit light of a second wavelength, and a third organic light emitting diode to emit light of a third wavelength;
   a phase difference layer, the phase difference layer including a first liquid crystal pattern on the first organic light emitting diode, and a second liquid crystal pattern on the second organic light emitting diode and the third organic light emitting diode; and
   a linear polarization layer on the phase difference layer,
   wherein the first liquid crystal pattern and the second liquid crystal pattern have different phase difference values, the second liquid crystal pattern having a λ/4 phase difference value of the second wavelength, and the first liquid crystal pattern having a λ/4 phase difference value of the first wavelength.

2. The organic light emitting diode display of claim 1, wherein the second liquid crystal pattern includes an inverse wavelength dispersion liquid crystal.

3. The organic light emitting diode display of claim 2, wherein the first liquid crystal pattern includes a positive wavelength dispersion liquid crystal.

4. The organic light emitting diode display of claim 3, wherein the first liquid crystal pattern and the second liquid crystal pattern have substantially the same thickness.

5. The organic light emitting diode display of claim 2, wherein the first liquid crystal pattern includes an inverse wavelength dispersion liquid crystal.

6. The organic light emitting diode display of claim 5, wherein the first liquid crystal pattern and the second liquid crystal pattern have different thicknesses.

7. The organic light emitting diode display of claim 2, wherein the first wavelength is greater than the second wavelength and the third wavelength, and the second wavelength is greater than the third wavelength.

8. The organic light emitting diode display of claim 7, wherein the first organic light emitting diode is to emit red light, the second organic light emitting diode is to emit green light, and the third organic light emitting diode is to emit blue light.

9. The organic light emitting diode display of claim 2, wherein the first wavelength is less than the second wavelength and the third wavelength, and the second wavelength is greater than the third wavelength.

10. The organic light emitting diode display of claim 9, wherein the first organic light emitting diode is to emit blue light, the second organic light emitting diode is to emit red light, and the third organic light emitting diode is to emit green light.

11. The organic light emitting diode display of claim 1, wherein the phase difference layer further includes:
    a base film having a front side on which the first liquid crystal pattern and the second liquid crystal pattern are located; and
    an overcoat layer for covering the first liquid crystal pattern and the second liquid crystal pattern.

12. The organic light emitting diode display of claim 11, further including a touch sensor on a rear side of the base film.

13. An organic light emitting diode display comprising:
a display module, the display module including a first organic light emitting diode to emit light with a first wavelength and a second organic light emitting diode to emit light with a second wavelength;
a phase difference layer, the phase difference layer including a first liquid crystal pattern on the first organic light emitting diode and a second liquid crystal pattern on the second organic light emitting diode; and
a linear polarization layer on the phase difference layer,
wherein the first liquid crystal pattern and the second liquid crystal pattern have different phase difference values, the second liquid crystal pattern having a $\lambda/4$ phase difference value of the second wavelength, and the first liquid crystal pattern having a $\lambda/4$ phase difference value of the first wavelength.

14. An optical unit disposed on a display module including a first organic light emitting diode to emit light with a first wavelength, a second organic light emitting diode to emit light with a second wavelength, and a third organic light emitting diode to emit light with a third wavelength, the optical unit comprising:
a phase difference layer including a first liquid crystal pattern on the first organic light emitting diode, and a second liquid crystal pattern on the second organic light emitting diode and the third organic light emitting diode; and
a linear polarization layer on the phase difference layer,
wherein the first liquid crystal pattern and the second liquid crystal pattern have different phase difference values, the second liquid crystal pattern having a $\lambda/4$ phase difference value of the second wavelength, and the first liquid crystal pattern having a $\lambda/4$ phase difference value of the first wavelength.

15. A method for manufacturing an optical unit on a display module including a first organic light emitting diode to emit light with a first wavelength, a second organic light emitting diode to emit light with a second wavelength, and a third organic light emitting diode to emit light with a third wavelength, the method comprising:
forming a liquid crystal layer on a base film, exposing portions of the liquid crystal layer by utilizing a mask to form a first liquid crystal pattern on the first organic light emitting diode and a second liquid crystal pattern on the second organic light emitting diode, and forming an overcoat layer for covering the first liquid crystal pattern and the second liquid crystal pattern to form a phase difference layer; and
forming a linear polarization layer on the phase difference layer,
wherein the first liquid crystal pattern and the second liquid crystal pattern have different phase difference values, the second liquid crystal pattern having a $\lambda/4$ phase difference value of the second wavelength, and the first liquid crystal pattern having a $\lambda/4$ phase difference value of the first wavelength.

* * * * *